United States Patent [19]
Drost et al.

[11] Patent Number: 6,084,452
[45] Date of Patent: Jul. 4, 2000

[54] CLOCK DUTY CYCLE CONTROL TECHNIQUE

[75] Inventors: Robert J. Drost; Jose M. Cruz, both of Palo Alto; Robert J. Bosnyak, San Jose, all of Calif.

[73] Assignee: Sun Microsystems, Inc, Palo Alto, Calif.

[21] Appl. No.: 09/107,898

[22] Filed: Jun. 30, 1998

[51] Int. Cl.$^7$ .................................................. H03K 3/017
[52] U.S. Cl. ......................... 327/175; 327/155; 327/163; 327/292
[58] Field of Search .................................. 327/175, 35, 2, 327/3, 4, 5, 6, 7, 8, 9, 10, 12, 1, 172, 173, 174, 176, 177, 178, 77, 39, 42, 155, 292, 163; 330/258

[56] References Cited

U.S. PATENT DOCUMENTS

| | | | |
|---|---|---|---|
| 4,460,985 | 7/1984 | Hoffman | 327/56 |
| 4,527,075 | 7/1985 | Zbinden | 307/265 |
| 5,053,639 | 10/1991 | Taylor | 327/155 |
| 5,057,702 | 10/1991 | Kitagawa | 327/175 |
| 5,231,320 | 7/1993 | Kase | 307/605 |
| 5,315,164 | 5/1994 | Broughton | 327/175 |
| 5,422,529 | 6/1995 | Lee | 327/536 |
| 5,477,180 | 12/1995 | Chen | 327/175 |
| 5,572,158 | 11/1996 | Lee et al. | 327/175 |
| 5,614,855 | 3/1997 | Lee et al. | 327/158 |

FOREIGN PATENT DOCUMENTS

| | | |
|---|---|---|
| 0 398751 A2 | 11/1990 | European Pat. Off. . |
| WO84/02621 | 7/1984 | WIPO . |

OTHER PUBLICATIONS

Stefanos Sidiropoulos and Mark Horowitz, "A 700–Mb/s/pin CMOS Signaling Interface Using Current Integrating Receivers," IEEE Journal of Solid–State Circuits, May 1997, vol. 32, No. 5, pp. 681–690.

Thomas H. Lee et al, FA 18.6: A 2.5V Delay–Locked Loop for an 18Mb 500MB/s DRAM, IEEE International Solid-–State Circuits Conference, High–Performance Logic and Circuit Techniques, Feb. 18, 1994, pp. 300–301.

Alex Waizman, "FA 18.5: A Delay Line Loop for Frequencey Synthesis of De–Skewed Clock," IEEE International Solid–State Circuits Conference, High Performance Logic and Circuit Techniques, Feb. 18, 1994, pp. 289–299.

*Primary Examiner*—Kenneth B. Wells
*Assistant Examiner*—Anh-Quan Tra
*Attorney, Agent, or Firm*—Skjerven, Morrill, MacPherson, Franklin & Friel, L.L.P.; William W. Holloway

[57] ABSTRACT

An apparatus adjusts the duty cycle of a single-ended clock signal. The single-ended clock signal oscillates between first and second voltages. The apparatus includes an error indication circuit, a duty cycle error measurement circuit and a duty cycle adjuster. The error indication circuit includes a reference circuit and a comparison circuit. The reference circuit is coupled to a first node having the first voltage and a second node having the second voltage to generate a reference signal from the first and second voltages. The reference circuit includes at least one instance of a first electrical characteristic cell. The comparison circuit is coupled to receive a feedback clock signal and to generate a comparison signal therefrom. The comparison circuit includes at least one instance of the first electrical characteristic cell. The duty cycle error measurement circuit is coupled to receive the reference signal and the comparison signal. The duty cycle error measurement circuit rejects the common mode of the reference and comparison signals and passes the differential mode of the reference and comparison signals to generate a duty cycle adjust signal responsive to receiving the reference and comparison signals. The duty cycle adjuster is coupled to receive an input clock signal and the duty cycle adjust signal and to provide the single-ended clock signal. The single-ended clock signal has a duty cycle determined at least in part by the duty cycle adjust signal.

15 Claims, 11 Drawing Sheets

CLOCK DUTY CYCLE CONTROL TECHNIQUE

BACKGROUND OF THE INVENTION

1. Field of the Invention

The present invention relates to synchronous electronic circuits, and, more particularly, to clock signal generation and control.

2. Description of the Related Art

In synchronous digital information processing equipment it is well known to use a clock source for developing control signals to time and synchronize circuit operations. It is common to utilize an oscillator circuit to produce a basic source frequency signal, which in turn is utilized to drive shaping circuitry for developing the desired rise and fall time and desired signal levels. The clock rate requirements for timing digital information processing systems are proportional to the switching speeds of the circuitry employed. As clock rates increase, tolerances are necessarily diminished, and clock skew becomes an ever-increasing problem. Furthermore, the duty cycle in synchronous digital systems is extremely critical when logic is synchronous to both the rising and falling edges of the clock (as is common in high performance processors for instance). A duty cycle error of just 5% for instance (from 50% to 45%) can actually cause a system clock to run at a maximum speed that is 10% lower, causing a significant impact on system performance.

Many circuits require a specific duty cycle for clocking signals to provide optimal performance. For example, multi-phase clocking systems often require a symmetrical wave shape that is characteristically desired to operate at a 50% duty cycle. Some applications require a duty cycle other than 50%. One use of non-50% duty cycles is in digital clocking where pulse-mode latching is used rather than edge-latching in order to reduce the setup-hold overhead associated with the latches. Control of the clock duty cycle is very critical in these higher performance systems. The precision of the duty cycle operation is especially critical in systems that utilize edge or transition triggering for generation of multi-phase clock signals, and is even more critical when both leading and trailing edges are utilized to generate the phase clocking signals. If a trailing edge of a clock signal varies from the leading edge of the clock signal, logic that triggers on the leading edge may have a tighter timing margin that logic that triggers on the trailing edge, or vice versa. Thus, there is a need for a duty cycle control technique that can target either or both of 50% and non-50% duty cycles.

Actual duty cycles typically do not have precisely the desired value. Even if a clock signal has the required duty cycle at some point in the system (e.g., at the output of an on-chip voltage controlled oscillator), the duty cycle will deviate from the required percentage as the clock signal is buffered and distributed throughout the chip. The buffer stages will give different duty cycle errors depending on process, temperature, and voltage conditions. In many cases, the desired duty cycle is not even available out of the voltage controlled oscillator (VCO) on chip or at the clock signal input of the chip. Thus, there is a need to control the duty cycle actively.

The basic function of a duty cycle adjustment circuit is to measure the error of the duty cycle and provide a correction signal to reduce that error. One approach to adjusting a duty cycle is disclosed in T. Lee, et al., "A 2.5V Delay-Locked Loop for an 18 Mb 500 MB/s DRAM," IEEE Int'l Solid-State Circuits Conf., Digest of Technical Papers, pp. 300–1, 1994. In Lee, a charge pump switches equal currents and creates the error measurements. However, this reference assumes that a complementary clock signal is being 50% duty cycle adjusted. Complementary clocks require additional generation and matching circuits if only a simple single-ended clock is needed. Also this method does not allow for any duty cycle other than 50% to be targeted. A similar approach is disclosed in S. Siridopoulos, M. Horowitz, "A 700-Mb/s/pin CMOS Signaling Interface Using Current Integrating Receivers," IEEE J. Solid-State Circuits, vol. 32, no. 5, pp. 681–690, May 1997. The Siridopoulos duty cycle correction technique is similar in principle to the Tom Lee reference and inherits its problems.

Another approach is disclosed in A. Waizman, "A Delay Line Loop for Frequency Synthesis of De-Skewed Clock," IEEE Int'l Solid-State Circuits Conf., Digest of Technical Papers, pp. 298–9, 1994. In Waizman, a single delay line delays the rising edge of an input clock twice and recycles the delayed edge one time rather than delaying the falling edge of the input clock. This method only targets a 50% duty cycle and is therefore limited in use if other duty cycles are desired. Also, the high to low delay through a delay line does NOT in general match the low to high delay through a delay line. Thus, there is also a static duty cycle error that is actually created by this technique.

Thus, there is a need to actively control clock signal duty cycles. There is also a need for such an active duty cycle control technique that can target non-50% duty cycles. It is desirable that such a control technique be simple, minimize jitter added by the control circuitry, and reduce or eliminate any static duty cycle errors that can be created by the adjustment circuit.

SUMMARY OF THE INVENTION

It has been discovered that a clock signal duty cycle may be corrected through the use of duty cycle error measurement circuits which use nonlinear conductances or transconductances to compare the duty cycle of the clock signal against a reference signal to generate a differential error signal. Such a configuration provides the advantage that process, voltage, and temperature dependent nonlinearities intrinsic in devices are effectively handled because such nonlinearities affect the common-mode level of the error signal, while only the differential-mode value of the error signal is used. The nonlinearities of an averaged clock signal are matched to the nonlinearities of the reference signal to remove the effects of the nonlinearities by rejecting the common mode of the averaged clock signal and reference signal.

A variety of circuits that low-pass filter and amplify the differential error signal are possible in accordance with the invention. One embodiment is particularly advantageous in presenting a new general purpose, compact and easily biased high common-mode rejection stage. Such a stage can also be used in different applications as a simple, robust, extremely low supply voltage operational amplifier which is compatible with a digital CMOS technology.

A duty cycle adjust control signal is generated which represents that differential error. A variety of circuits are possible to convert the control signal into a duty cycle adjustment. The control signal may be either single ended or differential.

For binary signal levels L1 and L2 of a clock signal (e.g., L1 may be $V_{DD}$ and L2 may be ground), wherein, during each cycle, the clock signal is at level L1 for period of time $T\{L1\}$ and the clock signal is at level L2 for a period of time $T\{L2\}$, the duty cycle is $T\{L1\}/(T\{L1\}+T\{L2\}) \cdot 100\%$. By ratioing the pull-up M or the pull-down N of reference conductances or transconductances vs. a clock conductance(s) or transconductance(s), any duty cycle of M/(M+N)·100% can be created using the same simple structure. Such a technique further provides the advantage that there is no offset error in the duty cycle created.

In one embodiment, a duty cycle error detection and control circuit is for use in adjusting a duty cycle of a single-ended feedback clock signal. The feedback clock signal oscillates between first and second clock level voltages. The circuit includes an error indication circuit and a common mode rejection circuit. The error indication circuit is coupled to receive a first clock level voltage signal, a second clock level voltage signal, and the feedback clock signal and is coupled to provide a differential error signal at first and second outputs. The differential error signal has a duty cycle reference component signal at the first output and a duty cycle feedback component signal at the second output. The error indication circuit includes first, second and third circuits. The first circuit has a first electrical characteristic. The first circuit has an input coupled to receive the first clock level voltage signal and an output coupled to the first output. The second circuit has the first electrical characteristic. The second circuit has an input coupled to receive the second clock level voltage signal and an output coupled to the first output. The duty cycle reference component signal at the first output is determined by a ratio of magnitudes of the first and second electrical characteristics. The third circuit has the first electrical characteristic. The third circuit has an input coupled to receive the feedback clock signal and an output coupled to the second output. The first, second and third circuits have inherent nonlinearities manifested as a common mode noise component of the differential error signal. The common mode rejection circuit is coupled to receive the differential error signal. The common mode rejection circuit is configured to reject the common mode noise component of the differential error signal and to provide a duty cycle adjust signal having a value determined by a difference between the duty cycle reference component signal and the duty cycle feedback component signal.

In another embodiment, a circuit is provided for generating a differential duty cycle error signal for use in calibrating a duty cycle of a feedback clock signal relative to the duty cycle error signal. The feedback clock signal oscillates between first and second voltages. The circuit includes a voltage divider. The voltage divider includes first and second conductance circuits. The first conductance circuit includes a first number of instances of a conductance cell coupled in parallel between a first node having the first voltage and a divider output. The first number is at least one. The second conductance circuit includes a second number of instances of the conductance cell coupled in parallel between a second node having the second voltage and the divider output. The second number is at least one. A ratio of the first number to the second number determines a duty cycle reference component signal of the differential duty cycle error signal. The divider output is coupled to provide the duty cycle reference component signal. The circuit further includes a third conductance circuit including a third number of instances of the conductance cell coupled in parallel. The third conductance circuit has an input coupled to receive the clock signal and an output coupled to provide a duty cycle compare component signal of the differential duty cycle error signal. The differential duty cycle error signal includes a common mode component determined by nonlinearities of the conductance cells and a differential mode component determined by a difference between a set duty cycle ratio represented by the duty cycle reference component signal and a measured duty cycle represented by the duty cycle compare signal.

In another embodiment, an apparatus is provided for adjusting the duty cycle of a single-ended clock signal. The single-ended clock signal oscillates between first and second voltages. The apparatus includes an error indication circuit, a duty cycle error measurement circuit and a duty cycle adjuster. The error indication circuit includes a reference circuit and a comparison circuit. The reference circuit is coupled to a first node having the first voltage and a second node having the second voltage to generate a reference signal from the first and second voltages. The reference circuit includes at least one instance of a first electrical characteristic cell. The comparison circuit is coupled to receive a feedback clock signal and to generate a comparison signal therefrom. The comparison circuit includes at least one instance of the first electrical characteristic cell. The duty cycle error measurement circuit is coupled to receive the reference signal and the comparison signal. The duty cycle error measurement circuit rejects the common mode of the reference and comparison signals and passes the differential mode of the reference and comparison signals to generate a duty cycle adjust signal responsive to receiving the reference and comparison signals. The duty cycle adjuster is coupled to receive an input clock signal and the duty cycle adjust signal and to provide the single-ended clock signal. The single-ended clock signal has a duty cycle determined at least in part by the duty cycle adjust signal.

In another embodiment, a method of controlling a duty cycle of a clock signal is provided. The clock signal oscillates between first and second clock voltage levels. The method includes receiving an input clock signal; providing an output clock signal; generating a duty cycle reference signal being equal to a percentage of the first and second clock voltage level signals by a first circuit; generating a duty cycle feedback signal from the output clock signal by a second circuit, the second circuit being integrated with the first circuit so that the first and second circuits manifest substantially similar nonlinearities; rejecting common mode nonlinearities of the duty cycle reference signal and the duty cycle feedback signal and amplifying the difference between the duty cycle reference signal and the duty cycle feedback signal by a sense circuit to provide a duty cycle adjust signal; adjusting a duty cycle of the input clock signal by an adjust circuit to provide the output clock signal with a duty cycle determined by the percentage of the first and second clock voltage level signals.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

DETAILED DESCRIPTION

The following sets forth a detailed description of a preferred embodiment of the invention. The description is intended to be illustrative of the invention and should not be taken to be limiting. Many variations, modifications, additions, and improvements may fall within the scope of the invention as defined in the claims that follow.

In one embodiment, a duty cycle error measurement circuit uses nonlinear conductances to compare the duty cycle of a clock signal against a reference signal. In another embodiment, a duty cycle error measurement circuit uses nonlinear transconductances to compare the duty cycle of the clock signal against a reference. The nonlinearities of the conductances/transconductances are matched in both of the compared signal paths and therefore are common mode nonlinearities. The signals are compared differentially so that the common mode nonlinearities are rejected. The reference signal is constructed from signals that are equal to the levels of the clock signal being duty cycle adjusted. In one standard CMOS embodiment, the reference signal is constructed from the power supplies in the circuit, which are the high and low levels of the clock which is being duty cycle adjusted. The nonlinear conductances are created simply and compactly by using pass-transistor PMOS and/or NMOS transistors, while the nonlinear transconductances are created simply and compactly using small common-source PMOS and NMOS transistors.

Figure 1:
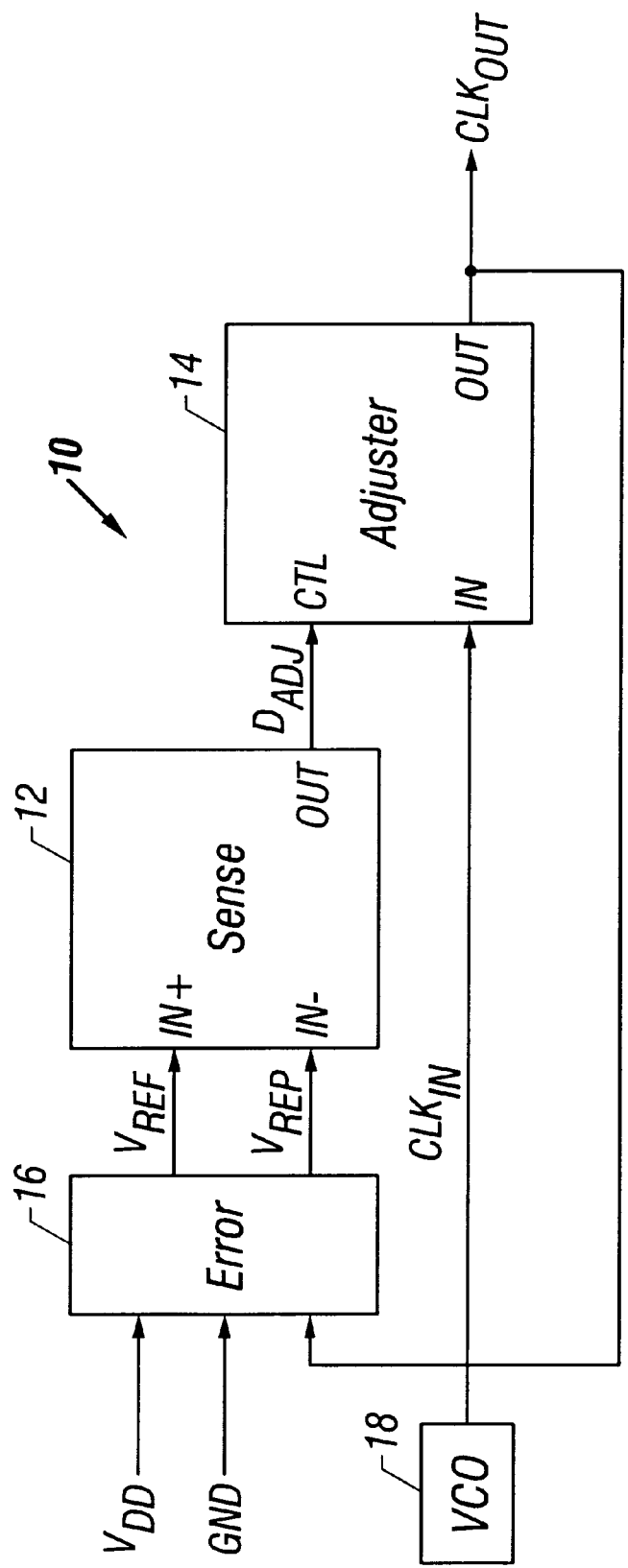
FIG. 1 is a block diagram of a duty cycle correction circuit according to the invention.

Referring to FIG. 1, duty cycle control circuit 10 includes duty cycle sense circuit 12, duty cycle adjuster 14 and error indication circuit 16. Sense circuit 12 senses or measures error in a clock signal duty cycle and generates an adjust control signal $D_{ADJ}$ responsive to the measured error. Adjuster 14 adjusts the duty cycle of a clock (e.g., a differential or single-ended clock $CLK_{IN}$) depending on the value of the adjust control signal $D_{ADJ}$ which is received from sense circuit 12. Feedback is provided to sense circuit 12 from adjuster 14 via error indication circuit 16. Particularly, a clock signal $CLK_{OUT}$ is provided by adjuster 14 to error indication circuit 16 which generates a differential error signal from the feedback clock signal $CLK_{OUT}$ and from the power rails $V_{DD}$ and ground. The differential error signal includes a reference component $V_{REF}$ and a feedback component $V_{REP}$. Error indication circuit 16 provides the differential error signal to the inputs of sense circuit 12.

More specifically, error indication circuit 16 receives a feedback clock signal $CLK_{OUT}$ from adjuster 14 and generates a feedback signal $V_{REP}$ therefrom. Error indication circuit 16 provides feedback signal $V_{REP}$ to the negative input IN− of sense circuit 12. Error indication circuit 16 is coupled to the $V_{DD}$ and ground power rails (or more generally, to D.C. signals replicating the high and low levels of $CLK_{OUT}$) and generates a reference signal $V_{REF}$ therefrom. Error indication circuit 16 provides the reference signal $V_{REF}$ to the positive input IN+ of sense circuit 12.

Sense circuit 12 measures the error of the feedback clock signal $CLK_{OUT}$ by comparing the reference and feedback nodes $V_{REF}$ and $V_{REP}$. Sense circuit 12 provides a duty cycle adjust signal $D_{ADJ}$ to adjuster 14. The value of adjust signal $D_{ADJ}$ depends on the comparison of $V_{REF}$ and $V_{REP}$. Optionally, sense circuit 12 may receive a reset signal at a reset input. (See, e.g., FIG. 5.) One embodiment of error indication circuit 16 and sense circuit 12 is described hereinafter with reference to FIG. 2.

Figure 7:
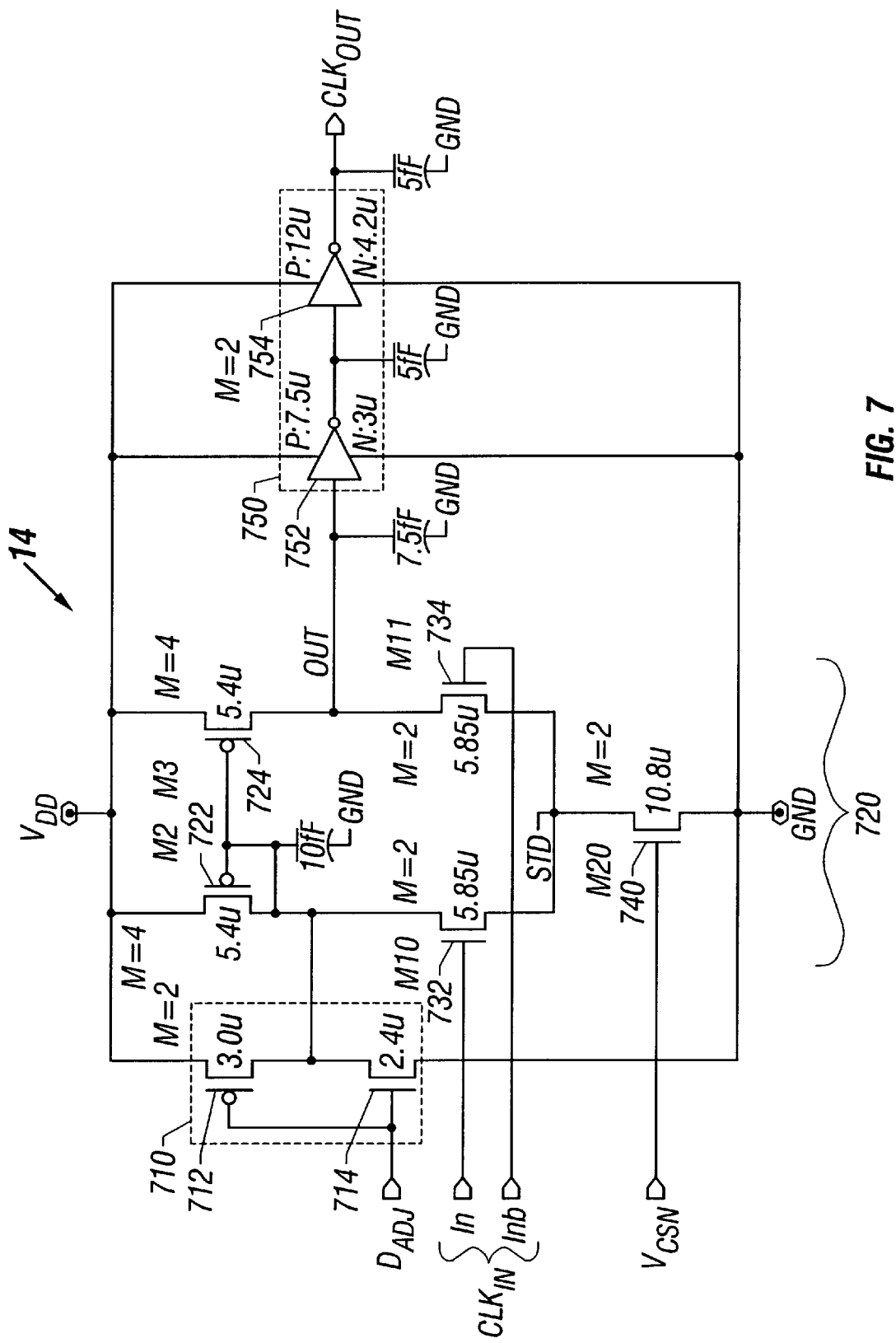
FIG. 7 is a circuit diagram of a duty cycle adjuster according to the invention.
Figure 8:
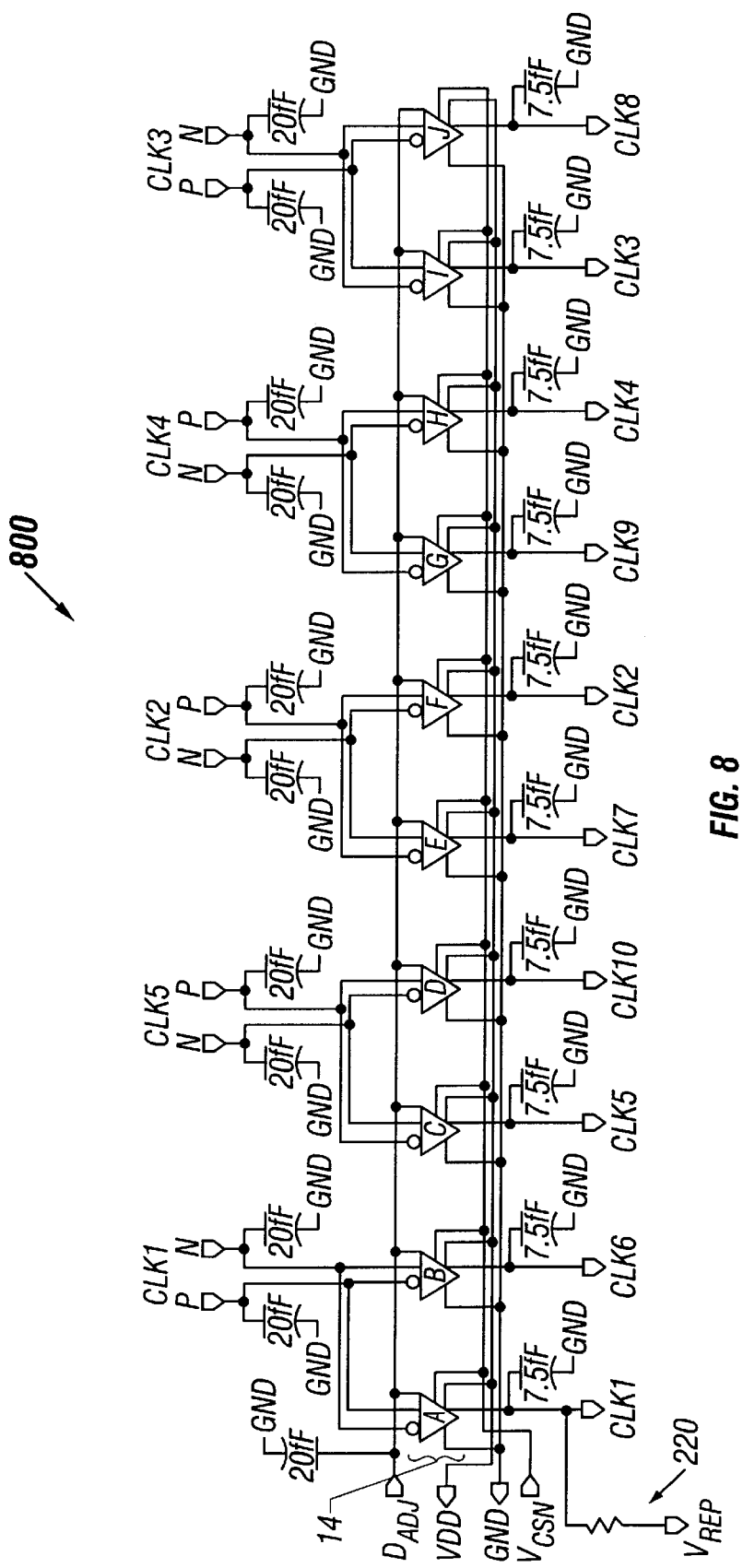
FIG. 8 is a circuit diagram of a clock distributor including ten duty cycle adjusters according to the invention.
Figure 9A:
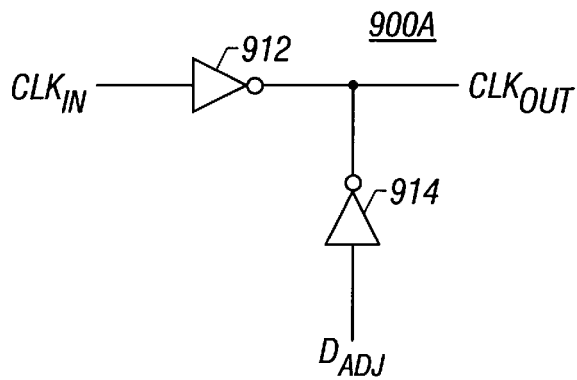
FIG. 9 shows various embodiments of duty cycle adjusters according to the invention.
Figure 9B:
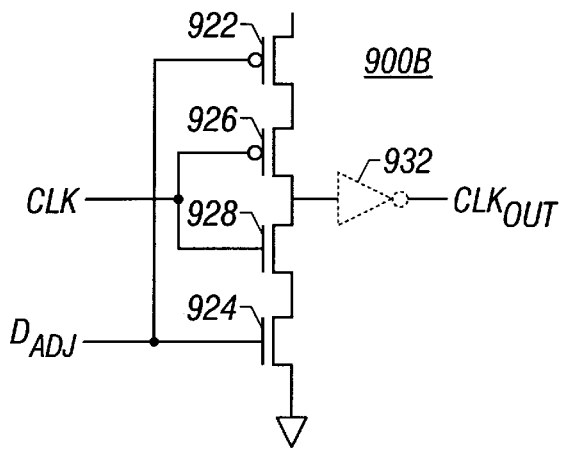
Figure 9C:
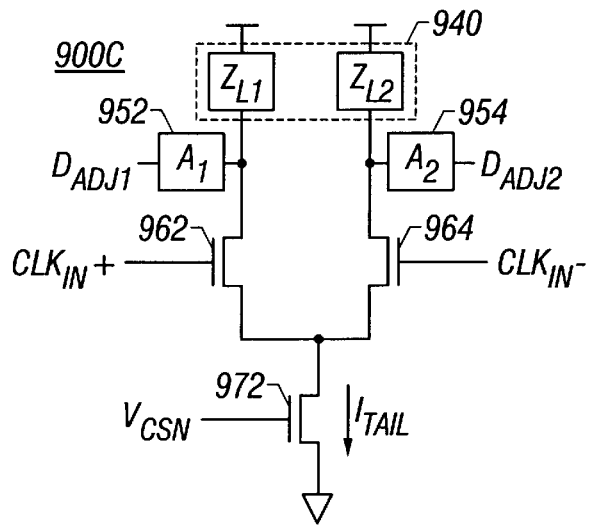
Figure 9D:
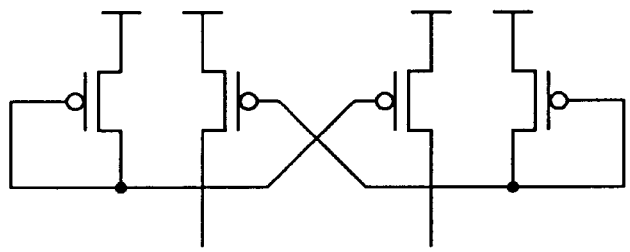
Figure 9E:
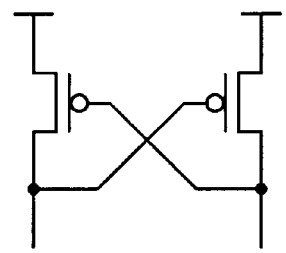

Adjuster 14 receives input clock signal $CLK_{IN}$ (e.g., a differential clock signal as shown in FIGS. 7 and 9C, or a single-ended clock signal as shown in FIGS. 9A and 9B) from voltage controlled oscillator (VCO) 18. In the case of a differential clock signal $CLK_{IN}$, adjuster 14 performs a differential to $C_{MOS}$ conversion of the input differential clock $CLK_{IN}$ to produce a single-ended clock $CLK_{OUT}$. Adjuster 14 receives the duty cycle adjust signal $D_{ADJ}$ at a control input and adjusts the duty cycle of the clock signal $CLK_{IN}$ to provide the single-ended clock signal $CLK_{OUT}$ with a duty cycle dependent upon the value of the adjust signal $D_{ADJ}$. Adjuster 14 may receive multiple differential or single-ended clocks and generate corresponding multiple adjusted clock outputs. In such a case, one of the adjusted clock outputs is provided as feedback to sense circuit 12. (See, e.g., CLK1 in FIG. 8, discussed hereinafter.)

Figure 2:
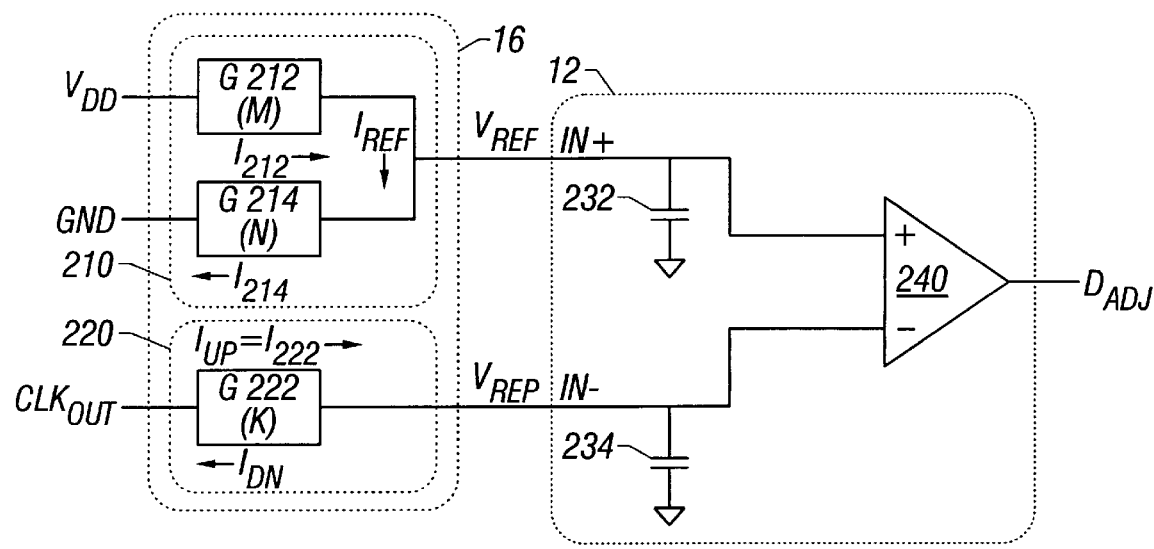
FIG. 2 is a circuit diagram of one embodiment of an error indication circuit and a duty cycle sense circuit according to the invention.

FIG. 2 shows one embodiment of error indication circuit 16 and duty cycle sense circuit 12. Error indication circuit 16 includes reference conductance circuit 210 and feedback conductance circuit 220. Reference conductance circuit 210 includes conductances 212 and 214, and feedback conduct conductance 222. Conductances 212, 214, 222 each provide a current path from an input node to an output node through a resistance portion and are further described hereinafter. Sense circuit 12 includes filter circuits 232, 234, and operational amplifier 240. Operational amplifier 240 may be any amplifier that will amplify a differential voltage and reject common mode voltages. One embodiment of amplifier 240 is described hereinafter with reference to FIGS. 5 and 6. Other embodiments of amplifier 240 are described hereinafter with reference to FIG. 10.

Power rails $V_{DD}$ and ground are coupled to conductances 212 and 214, respectively, to generate a reference signal, particularly a reference voltage, at the positive amplifier input node. The reference voltage $V_{REF}$ is determined by the ratio of the values of conductances 212 and 214 (referred to herein as M and N, respectively). Conductances 212 and 214 essentially provide a voltage divider which determines the reference voltage. For example, if the ratio M:N is 3:1, the reference signal will have a value at or near ¾ of $V_{DD}$. As will be shown, such a ratio selects a duty cycle of 25% (i.e., 25% active, 75% inactive). Other ratios of conductances may be used to select different duty cycles. Importantly, the presence of nonlinearities in conductance 212, 214 and 222 complicates the above analysis such that a precise voltage value $V_{REF}$ may not be calculable. However, as long as the nonlinearities of reference conductance circuit 210 are matched to those of feedback conductance circuit 220, the nonlinearities are canceled out by the common mode rejection of amplifier 240. Thus, the reference voltage $V_{REF}$ is determined by M:N and any potential nonlinearities in conductances 212, 214, but the effect of such nonlinearities may be ignored through the use of a matched conductance 222 to generate the feedback signal $V_{REP}$.

Figure 3:
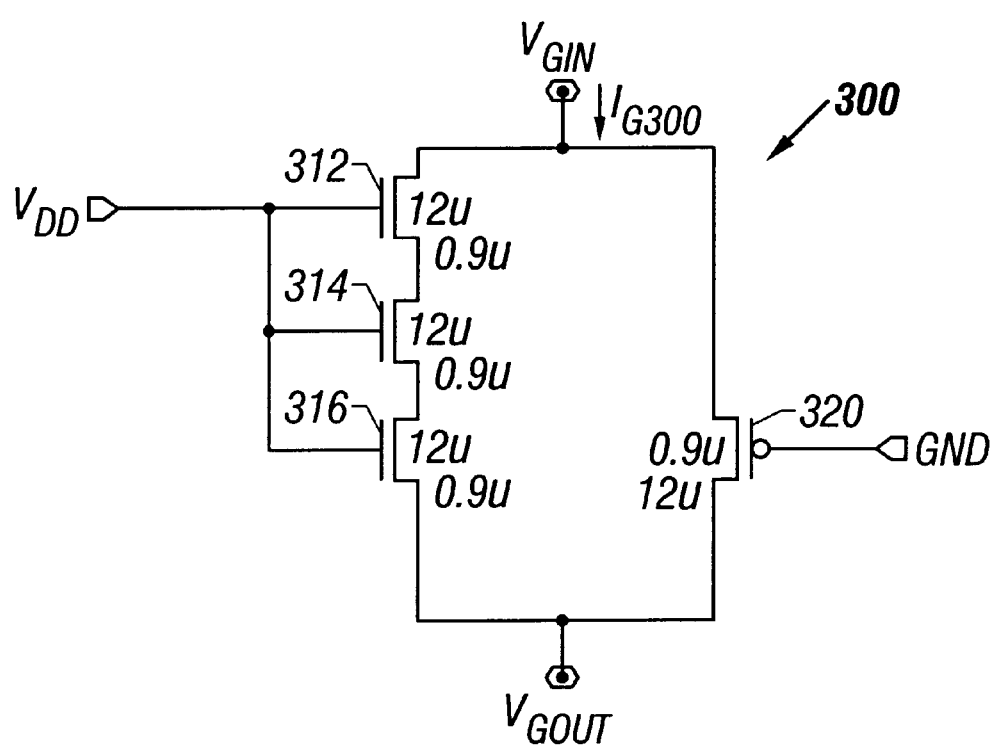
FIG. 3 is a circuit diagram of a conductance circuit of the error indication circuit of FIG. 2.

Each of conductances 212, 214, 222 is implemented using one or more of conductance cell 300 shown in FIG. 3.

Conductance cell 300 includes three series NMOS pass transistors 312, 314, 316 coupled in parallel with PMOS pass transistor 320 between an input terminal $V_{GIN}$ and an output terminal $V_{GOUT}$. The higher potential power rail $V_{DD}$ is coupled to the gates of NMOS transistors 312, 314 and 316 so that NMOS transistors 312, 314 and 316 are conducting for input signals $V_{GIN}$ and $V_{GOUT}$ from ground to within a few hundreds of millivolts of $V_{DD}$ (where the resistance of transistors 312, 314, 316 increases substantially). The lower potential power rail ground is coupled to the gate of PMOS transistor 320 so that PMOS transistor 320 is conducting for input signals $V_{GIN}$ and $V_{GOUT}$ from $V_{DD}$ to within a few hundreds of millivolts of ground (where the resistance of transistor 320 increases substantially).

The conductance cell 300 of FIG. 3 provides a substantially symmetrical resistance over input signal $V_{GIN}$ swings in the fashion of a conducting transmission gate. The PMOS transistor 320 has approximately the same resistance as the three series NMOS transistors 312, 314, 316. The sizes of transistors 312, 314, 316, 320 are shown in FIG. 3 for a 0.6 micron technology. The resistance of conductance cell 300 is preferably greater than 20 kΩ for setting a specific time constant capacitance within the range of capacitors available in an integrated circuit process. The setting of these values affects both the servo loop dynamics and the supply noise rejection. The resistance of conductance cell 300 may be any value as necessary.

Referring to FIGS. 2 and 3, the same conductance cell 300 is used in each of conductances 212, 214, 222. Different numbers of the conductance cell 300 are coupled in parallel in each of conductances 212, 214 and conductance 222 to provide different M:N ratios and different K values, respectively. For example, two conductance cells 300 coupled in parallel generate a conductance factor that is twice that of only one conductance cell 300. In other words, the resistance of two conductance cells 300 coupled in parallel is one-half the resistance of one conductance cell 300.

The feedback CMOS clock signal is either at $V_{DD}$ or ground, with relatively quick transitions between the two power rails. In operation, duty cycle control circuit 10 adjusts the duty cycle of the clock signal to match the ratio of time spent at $V_{DD}$ versus time spent at ground to the M:N ratio of conductances 212, 214 which couple the reference node $V_{REF}$ to $V_{DD}$ and ground. Any non-linear conduction characteristics of the PMOS and NMOS pass transistors of conductances 212, 214, 222 have identical effects on the reference voltage $V_{REF}$ and the averaged CMOS clock feedback voltage $V_{REF}$ when the reference and feedback voltages $V_{REF}$ and $V_{REP}$ are equal, as they are when the duty cycle correction control loop is in an equilibrium state. Thus, although the PMOS and NMOS transistors of feedback conductance circuit 220 include nonlinearities and body effect dependencies on their source terminal voltage, such non-ideal effects are matched by the PMOS and NMOS transistors of reference conductance circuit 210 and are thus common mode nonlinearities with respect to the differential error signal carried by nodes $V_{REF}$ and $V_{REP}$.

Referring again to FIG. 2, reference conductance circuit 210 forms a voltage divider including conductances 212 and 214. Conductances 212 and 214 are coupled via their respective output nodes $V_{GOUT}$. Conductances 212 and 214 are respectively coupled to $V_{DD}$ and ground at their input nodes $V_{GIN}$. The reference voltage at node $V_{REF}$ is determined by the M:N ratio of conductances 212, 214 of reference conductance circuit 210.

As noted, multiple conductance cells 300 may be coupled in parallel to create a conductance having a factor equal to the number of conductance cells. For example, conductance 212 includes M of conductance cells 300 coupled in parallel and consequently has a factor of M. Conductance 214 includes N of conductance cells 300 coupled in parallel and consequently has a factor of N. Conductance 222 includes K of conductance cells 300 coupled in parallel and consequently has a factor of K.

For an M:N ratio of 3:1, conductance 212 includes three conductance cells 300 coupled in parallel, and conductance 214 includes one conductance cell 300.

Feedback conductance circuit 220 receives an input clock signal at the output node of conductance 222 and generates an averaged feedback signal at the output node of conductance 222. In one embodiment, conductance 222 includes a single conductance cell 300 so that the K factor for conductance 222 is one. However, different K factors may be used for conductance 222 to tune the RC time constant of the RC structure including conductance 222 and filter 234 so that residual voltage ripple on the $V_{REP}$ and $D_{ADJ}$ is within an allowable range.

A pure resistance analysis for determining $V_{REF}$ shows that $$V_{REF} = \frac{R_{214}}{(R_{212} + R_{214})} V_{DD}$$

$$V_{REF} = \frac{M}{(M + N)} V_{DD}$$

The resistance of conductance 212 having an M factor of 3 is ⅓ the resistance of conductance 214 having an N factor of 1. Thus, an M:N ratio of 3:1 generates a reference voltage $V_{REF}$ that is ¾ or 75% of $V_{DD}$.

As discussed above, however, conductances 212 and 214 may be nonlinear. Consequently, $V_{REF}$ may not be exactly determinable. Accordingly, conductance 222 is used to replicate and hence cancel out the nonlinear effect of conductances 212 and 214. For example, the $CLK_{OUT}$ signal in the low state (equal to ground in the present example) pulls a current $I_{DN}$ through conductance 222 from the $V_{REP}$ node. When $V_{REP}=V_{REF}$ (feedback enforces this condition in equilibrium), GND pulls an identical current $I_{214}$ ratioed simply by N/K, or $N/K \cdot I_{DN}$ from the $V_{REF}$ node. When the clock signal is in the high state (equal to $V_{DD}$ in the present example), it pushes a current $I_{UP}$ through conductance 222 onto the $V_{REP}$ node. When $V_{REP}=V_{REF}$, $V_{DD}$ pushes a precisely ratioed current $I_{212}=M/K \cdot I_{UP}$ onto the $V_{REF}$ node. The same nonlinearities occur on the $V_{REP}$ node as on the $V_{REF}$ node so that the nonlinearities are common mode noise in the differential error signal generated by error indication circuit 16. The differential amplifier 240 of sense circuit 12 rejects the common mode of the differential error signal.

More specifically, the current $I_{G300}$ through conductance cell 300 is a potentially nonlinear function of both terminal voltages $V_{GIN}$ and $V_{GOUT}$ such that $I_{G300}=G_{300}(V_{GIN}, V_{GOUT})$.

Because the function $G_{300}$ is potentially nonlinear, the current $I_{G300}$ may not be exactly known. Also, as noted, conductance 212 includes M of conductance cells 300 coupled in parallel and consequently has a factor of M. Thus, the current $I_{212}$ through conductance 212 is defined as follows:

$I_{212}=M \cdot G_{300}(V_{DD}, V_{REF})$.

In the conductance embodiment of FIG. 2, $I_{212}$ is defined as the current from $V_{DD}$ to $V_{REF}$, and $I_{214}$ is defined as the current from ground to $V_{REF}$. Incorporating the M and N factors, the $I_{212}$ and $I_{214}$ currents at equilibrium (no net current flow onto/off of $V_{REF}$ node) are as follows:

$$I_{212}=M \cdot G_{300}(V_{DD}, V_{REF})=I_{214}=N \cdot G_{300}(V_{REF}, V_{GND})=I_{REF}$$

In the case of pure resistance, for example, $I_{212}$ and $I_{214}$ may be described as follows:

$$I_{212}=M \cdot G_{300}(V_{DD}, V_{REF})=M \cdot (V_{DD}-V_{REF})/R_{300}$$

$$I_{214}=N \cdot G_{300}(V_{REF}, V_{GND})=N \cdot (V_{REF}-V_{GND})/R_{300}$$

The current $I_{222}$ through conductance 222 includes $I_{DN}$ and $I_{UP}$. $I_{UP}$ is defined as any current flowing from the $CLK_{OUT}$ node to the $V_{REF}$ node, and $I_{DN}$ is defined as any current flowing from the $V_{REF}$ node to the $CLK_{OUT}$ node. When the feedback clock signal $CLK_{OUT}$ is at $V_{DD}$, $I_{DN}=0$. Therefore, $$I_{222}=I_{UP}=K \cdot G_{300}(V_{DD}, V_{REP})$$

where the K applied to G300 is the factor of conductance 222. Further, when the feedback clock signal $CLK_{OUT}$ is at ground voltage, $I_{UP}=0$. Therefore, $$I_{222}=I_{DN}=K \cdot G_{300}(V_{REP}, V_{GND})$$

Duty cycle control circuit 10 adjusts the duty cycle of $CLK_{OUT}$ so that the average $V_{REP}$ equals the average $V_{REF}$. In the locked state, $CLK_{OUT}$ has a constant duty cycle and the average $V_{REP}$ is constant. Therefore, the average $I_{UP}$ equals the average $I_{DN}$, so that the average $I_{222}=0$. If the clock is high X·100% of the time (e.g., X is a fraction defining the duty cycle), average $I_{UP}$ and average $I_{DN}$ are as follows:

$$avg(I_{UP})=X \cdot K \cdot G_{300}(V_{DD}, V_{REP})=X \cdot K/M \cdot I_{REF}$$

$$avg(I_{DN})=(1-X) \cdot K \cdot G_{300}(V_{REP}, V_{GND})=(1-X)K/N \cdot I_{REF}$$

where $G_{300}(V_{DD}, V_{REP})$ is replaced by $I_{REF}/M$ and where $G_{300}(V_{REP}, V_{GND})$ is replaced by $I_{REF}/N$ (from the equations defining $I_{212}$ and $I_{214}$ above). Thus, because $avg(I_{UP})=avg(I_{DN})$ in the locked state, $$X \cdot K/M \cdot I_{REF}=(1-X) \cdot K/N \cdot I_{REF}$$

By canceling out $I_{REF}$ and K, $$X/M=(1-X)/N$$

$$X \cdot N = M - X \cdot M$$

$$X(N+M)=M$$

$$X=M/(M+N)$$

The above equation shows how M and N can be chosen to set any duty cycle X·100%. For example, selecting M=1 and N=1 targets X=0.5 for a 50% duty cycle. Selecting M=1, N=3 targets X=0.25 for a 25% duty cycle. Selecting M=4, N=1 targets X=0.8 for an 80% duty cycle.

If the loop is not locked and X is higher than the targeted duty cycle (i.e., the actual duty cycle is too high), then $avg(I_{DN}) \neq avg(I_{UP})$ such that $avg(I_{222})$ changes in a negative feedback direction that causes $D_{ADJ}$ to change in a direction such that adjuster 14 decreases the duty cycle of $CLK_{OUT}$ and, hence, decreases X. More specifically, $avg(I_{222})$ is positive when the duty cycle is too high. A positive $avg(I_{222})$ increases $V_{REP}$ relative to $V_{REF}$ so that $D_{ADJ}$ decreases. When $D_{ADJ}$ decreases, adjuster 14 decreases the duty cycle of $CLK_{OUT}$ by slowing down the rising transitions and speeding up the falling transitions of $CLK_{IN}$.

If the loop is not locked and X is lower than the targeted duty cycle (i.e., the actual duty cycle is too low), then $avg(I_{DN}) \neq avg(I_{UP})$ such that $avg(I_{222})$ changes in a positive feedback direction that causes $D_{ADJ}$ to change in a direction such that adjuster 14 increases the duty cycle of $CLK_{OUT}$ and, hence, increases X. More specifically, $avg(I_{222})$ is negative when the duty cycle is too low. A negative $avg(I_{222})$ decreases $V_{REP}$ relative to $V_{REF}$ so that $D_{ADJ}$ increases. When $D_{ADJ}$ increases, adjuster 14 increases the duty cycle of $CLK_{OUT}$ by speeding up the rising transitions and slowing down the falling transitions of $CLK_{IN}$. The above analysis also applies to the transconductance case (see, e.g., FIG. 4 and discussion hereinafter) except that the current onto node $V_{REP}$ comes from a third terminal (e.g., node $V_{DD}$) and the input node is a control voltage input coupled to receive $CLK_{OUT}$.

Thus, an M:N ratio of 1:1 selects a 50% duty cycle. Any ratio of M:N may be used to select any duty cycle, For example, in the embodiment shown, a 25% duty cycle is targeted by the control loop of duty cycle control circuit 10 by ratioing conductances 212, 214, and therefore the power supplies, in a 3:1 ratio to create a reference voltage $V_{REF}$ to compare against the average value of a $C_{MOS}$ clock feedback signal $V_{REP}$. The comparison is made by operational amplifier 240 which is further described hereinafter. In the presently described embodiment, the 25% duty cycle clock is an active low clock, so that a 25% duty cycle means 25% low, 75% high. A 25% duty cycle (as opposed to the typical 50% duty cycle) provides improvements in sense amplifier operation because equalization requires less time than amplification. A 25% duty cycle also provides improvements in input capacitance in input samplers that track the input signal during the 25% low time, and in time margin in the second latching stage and half clock generation stage.

Filter circuit 234 of sense circuit 12 includes a capacitor to provide a low pass filter that sets a dominant pole for the system to provide stability to the control loop formed by the feedback of duty cycle control circuit 10. Matched low pass filter circuit 232 reduces high frequency noise on $V_{DD}$/ground from being amplified to the adjust signal. Initial locking takes approximately 100 ns, and no lock states are possible on start-up because there are no positive feedback parasitic loops. In order to have minimal loading on the CMOS clock being averaged, the RC portion of duty cycle control circuit 10 including conductance 222 and the capacitance of filter circuit 234 was chosen to be the dominant pole of the system and has a time constant of about 10 Mhz for typical process and normal operating conditions. The dominant pole can be set to any arbitrarily lower or higher value as well if appropriate to the clock frequency of the system.

As noted, the dominant pole of the feedback loop formed by the feedback clock signal is the feedback node $V_{REP}$ which is filtered via filter circuit 234. Because the node of the duty cycle adjust signal $D_{ADJ}$ that shifts the CMOS clock's duty cycle is not the dominant pole of the feedback loop, operational amplifier 240 is allowed to drive $D_{ADJ}$ to an extreme value if the reference voltage $V_{REF}$ is ever quickly bounced (e.g., because of a power supply bounce). This could introduce a large amount of phase shift and thus phase noise in the rising edges of CMOS clock signal $CLK_{OUT}$, and could momentarily halt data recovery by driving the duty cycle of $CLK_{OUT}$ to an extreme cycle percentage. To avoid this behavior, the reference voltage $V_{REF}$ is also filtered via filter circuit 232. The RC circuit formed by conductances 212, 214 and the capacitance of filter circuit 232 has a time constant set below that of the control loop formed by conductance 222 and filter circuit 234 so that power supply bounces are tracked by the control loop without requiring large shifts in the duty cycle control signal $D_{ADJ}$.

Figure 5:
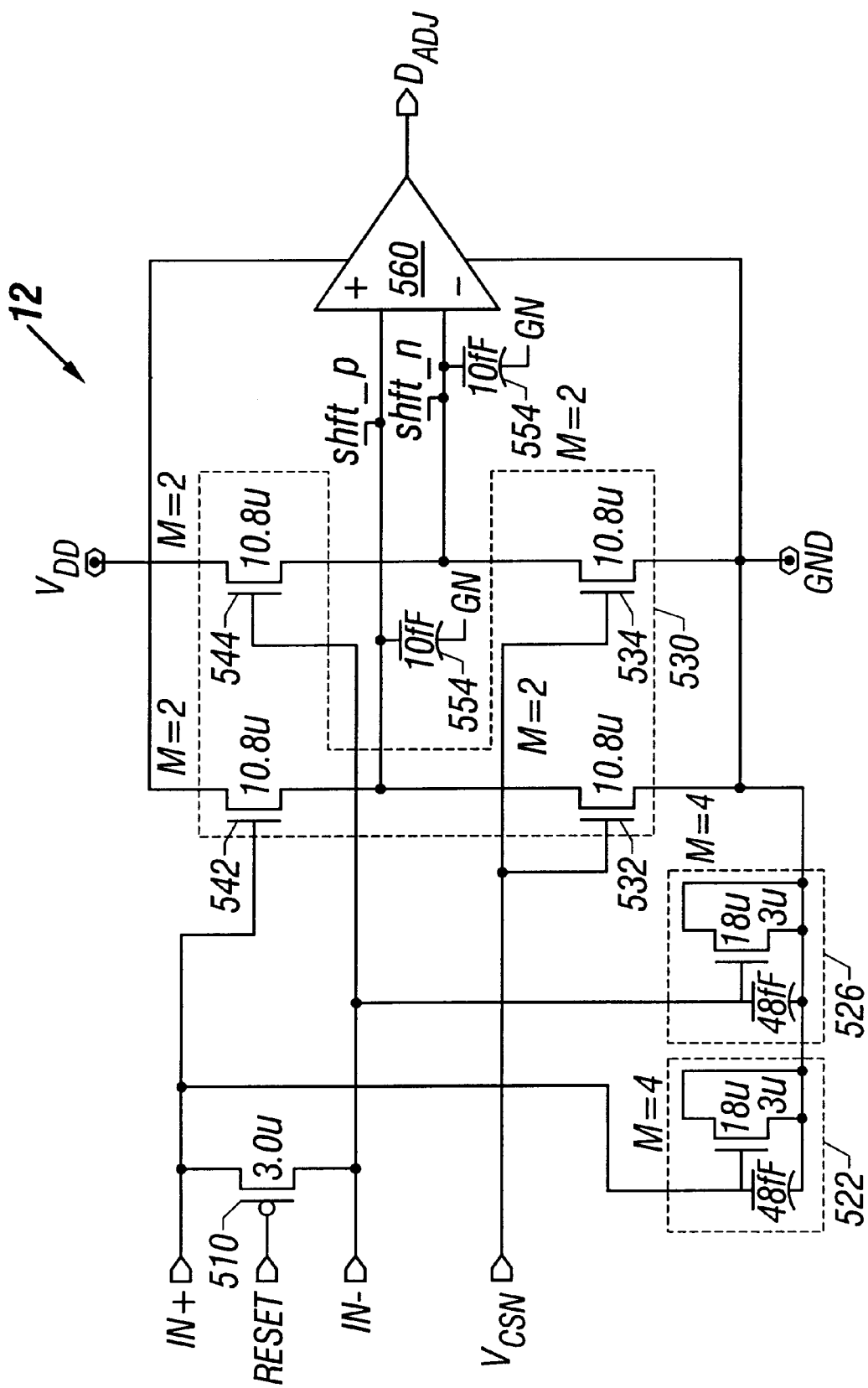
FIG. 5 is a circuit diagram of a duty cycle sense circuit according to the invention.

Referring to FIG. 5, one embodiment of sense circuit 12 includes reset circuit 510, a capacitance circuit including capacitances 522 and 526, level shifter stage 530, a capacitance circuit including capacitances 552 and 554, and operational amplifier 560. Sense circuit 12 receives a differential error signal including a reference signal $V_{REF}$ at the positive input IN+ and a feedback signal $V_{REF}$ at the negative input IN−. Sense circuit 12 generates and outputs adjust signal $D_{ADJ}$ which is used by adjuster 14 to select a desired duty cycle.

Reset circuit 510 includes a PMOS transistor which receives a reset signal at its gate and ties the positive and negative inputs IN+ and IN− together when the reset signal is low. When sense circuit 12 is reset by reset circuit 510, sense circuit 12 is forced into a stable state during initialization when the duty cycle can have any starting value. Reset circuit 510 prevents a lock-up condition during initialization in some external circuitry such as a phase-locked loop (PLL) used for clock recovery (e.g., if the duty cycle is 0% at start-up and stays 0% due to correction in the wrong direction).

The positive and negative inputs IN+ and IN− are coupled to ground via respective capacitance circuits 522 and 526. In the embodiment shown, capacitance circuits 522 and 526 each include a capacitor and a capacitor-configured transistor. The input nodes IN+ and IN− are coupled to capacitance circuits 522 and 526, respectively, to filter the corresponding currents and to reduce voltage swings having high frequency components.

The positive and negative inputs IN+ and IN− are coupled to a signal level shifter input stage 530. Specifically, the positive and negative inputs IN+ and IN− are coupled to NMOS source followers 542 and 544. A bias control circuit receives bias current control signal $V_{CSN}$ at the gates of NMOS transistors 532 and 534. Bias current control signal $V_{CSN}$ is an NMOS control voltage that is used to provide current sources at NMOS transistors 532, 534 to regulate the current through transistors 542, 544 in level shifter stage 530. Input voltages IN+ and IN− are level shifted down by source followers 542, 544. Operational amplifier 560 includes a PMOS differential pair. Source followers 542, 544 shift the input voltages down so that the input voltages are not within a PMOS threshold voltage of $V_{DD}$ to ensure that the PMOS devices of amplifier 560 are saturated.

Figure 6:
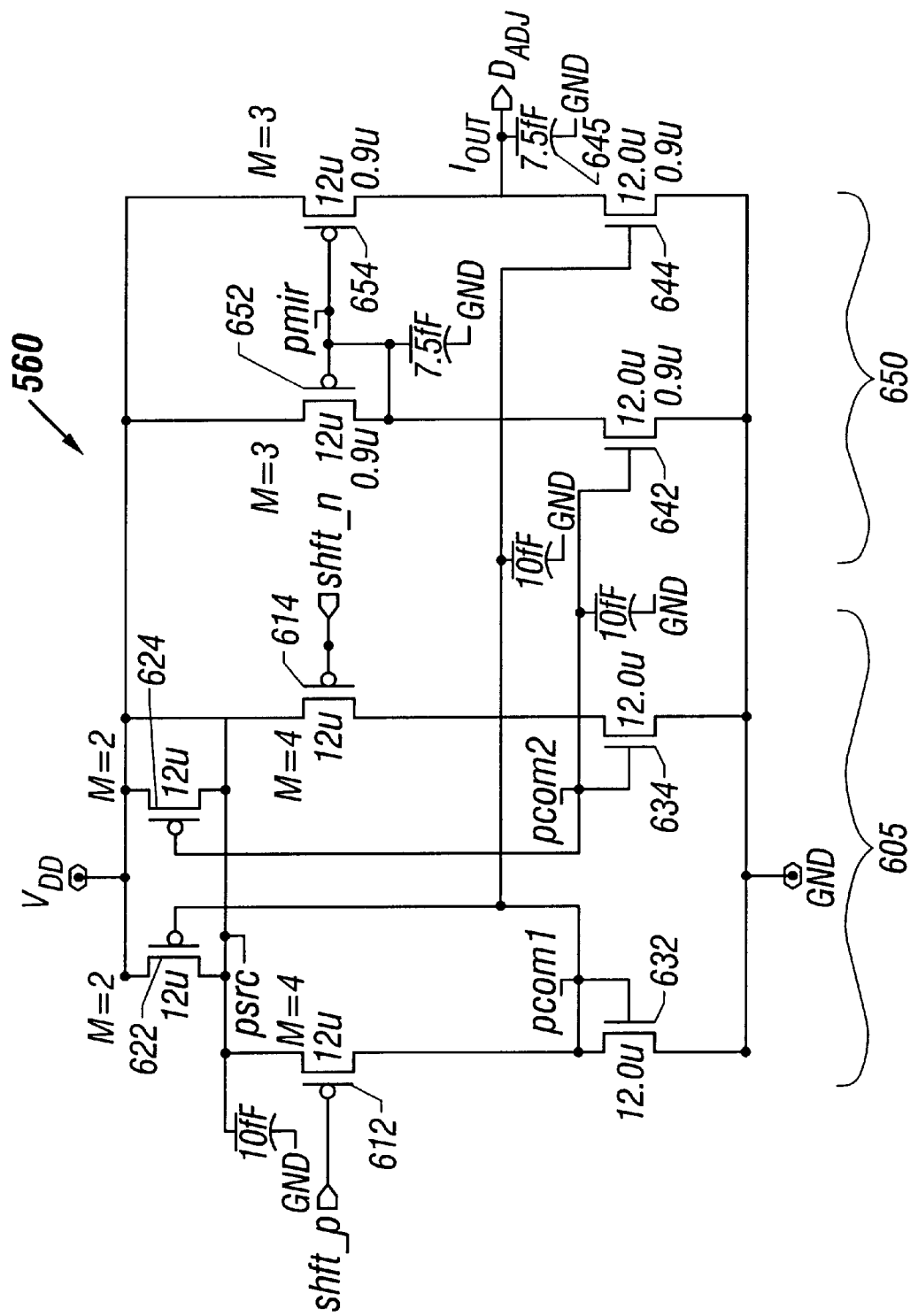
FIG. 6 is a circuit diagram of a duty cycle sense circuit amplifier according to the invention.

Referring to FIG. 6, self-biasing amplifier 560 has positive and negative input nodes shft_p and shft_n which carry respective reference and feedback signals. Amplifier 560 drives an output signal $D_{ADJ}$, the value of which is dependent on the comparison of the reference signal shft_p and the feedback signal shft_n. Amplifier 560 includes a first amplification stage 605 and a second amplification stage 650. First amplification stage 605 includes differential input pair 612, 614, bias current pair 622, 624, diode load transistors 632, 634. Second amplification stage 650 includes output transistors 642, 644, and PMOS folded load transistors 652, 654 which provide a current mirror pair.

First amplification stage 605 includes a differential amplifier having a source coupled, PMOS differential input pair 612, 614. The tail current for the differential pair is provided by transistors 622, 624. Amplifier 560 self-biases by deriving the tail current from an average of the voltage on the two output nodes of the PMOS differential pair of the first stage (nodes pcom1 and pcom2). Differential input pair 612, 614 differentially steers current into respective NMOS diode connected transistors 632, 634 (nodes pcom1, pcom2), each of which are coupled in a current mirror configuration with respective output NMOS transistors 642, 644.

The output transistors 642, 644 of second amplification stage 650 are controlled by the gate-to-source voltage $V_{GS}$ of the diode connected transistors 632, 634. Due to the differing gate lengths of transistors 632, 634 (0.6μ) and 642, 644 (0.9μ), output transistors 642, 644 cause less but proportional current $I_{OUT}$ to be steered onto the output node $D_{ADJ}$. Output transistors 642, 644 have longer channel lengths to immunize the output signals from channel length modulation effects. Output signal $D_{ADJ}$ is a voltage signal which is provided at the output of second amplification stage 650 and which results from capacitor 645 being charged by $I_{OUT}$.

Referring to FIG. 7, adjuster 14 includes adjust circuit 710, differential amplifier 720 and buffer stage 750. Differential amplifier 720 includes folded PMOS load transistors 722, 724, differential input pair NMOS transistors 732, 734, and current source NMOS transistor 740. The gates of transistors 732 and 734 receive differential clock signal $CLK_{IN}$ at differential inputs in and inb, respectively. The gate of tail current source transistor 740 receives bias current control signal $V_{CSN}$. Buffer stage 750 includes inverters 752 and 754.

Adjuster 14 generates a single-ended CMOS clock from the differential clock input pair or a single-ended clock. Specifically, differential amplifier 720 amplifies a differential input signal at in, inb to a CMOS level output signal out. Adjust circuit 710 receives adjust signal $D_{ADJ}$ at the gates of transistors 712, 714, and adds or subtracts current to or from the PMOS diode portion of the PMOS folded load (i.e., the drain of PMOS transistor 722). Differential amplifier outputs a CMOS level clock at the drain of PMOS transistor 724. Adjust circuit 710 speeds up the rising transition and slows down the falling transition (or vice-versa) of the CMOS clock by adding (or subtracting) current from the diode load node of amplifier 720. The CMOS clock is buffered by buffer stage 750. Thus, adjuster 14 converts the differential clock phases into a CMOS clock having appropriate duty cycle and transition times to drive the latching circuits.

The differential clock is sent through one differential stage identical to that of a VCO 18 prior to adjuster 14 to provide buffering. The output of this stage is then coupled to duty cycle adjuster 14 of FIG. 7. Adjuster 14 provides a differential-to-CMOS converter which uses a differential buffer with a bias current proportional to that of VCO 18 to ensure sufficient speed. The bias current is provided by the tail current source transistor 740 which is controlled by $V_{CSN}$. Bias current control signal $V_{CSN}$ is an NMOS control voltage that is used to set the current through NMOS transistor 740 located in the tail of differential amplifier 720. VCO 18 may use, for example, any typical VCO techniques such as a ring oscillator, a relaxation oscillator, an L-C oscillator, etc.

Adjuster 14 buffers the VCO 18 clock signal $CLK_{IN}$ because the loading of sense amplifiers, latches, etc., can be too much to place on VCO 18 directly. PMOS folded current load transistors 722 and 724 provide a first amplification of the clock signal to the CMOS level which is followed by two stages of CMOS inverter amplification via CMOS inverters 752, 754 of buffer stage 750. In one embodiment of buffer stage 750, the PMOS/NMOS width ratios are skewed so that the channel widths of the pull-up transistors are larger than the channel widths of the pull-down transistors to emphasize a fast rising transition on the CMOS clock. Such a skewed ratio is useful for rising edge triggered sense-amplifiers and latches which need a fast edge to reduce their setup-hold metastability window. In the embodiment of FIG. 7, inverter stage 752 has a pull-up to pull-down ratio of 2.5 and inverter stage 754 has a pull-up to pull-down ratio of approximately 2.9.

Because of mismatches between the output midpoint of the differential folded PMOS load stage and the input threshold of the CMOS inverters, the duty cycle of the CMOS clock could vary greatly across frequency of operation, temperature, power supply, and process. In some conditions the duty cycle could vary to extremes of zero or 100% and data recovery would not be conducted at all. Therefore, in order to prevent duty cycle variations due to such conditions, biasing circuit 710 adjusts the duty cycle of the CMOS clock by adding or subtracting current from the PMOS diode load. The control circuit 10 monitors the average value of the CMOS clock by passing it through high resistivity PMOS/NMOS pass transistors (See, e.g., FIG. 3 and accompanying discussion) and comparing it to a reference voltage that is generated at a selected level between the two power supplies.

The overall operation of the circuit may be more fully understood with reference to the following example. If the targeted duty cycle is 50% but the actual duty cycle is more than 50%, $CLK_{OUT}$ is at $V_{DD}$ more than at ground instead of being $V_{DD}$ and ground an equal amount of time. Referring to FIGS. 1 and 2, because $CLK_{OUT}$ is spending more time at $V_{DD}$ than at ground, $avg(I_{222})$ is positive which increases $V_{REP}$ in relation to $V_{REF}$ so that $D_{ADJ}$ decreases to decrease the duty cycle of $CLK_{OUT}$. Referring to FIG. 7, when $D_{ADJ}$ decreases, the voltage at the common drains of transistors 722, 732 and the common gates of transistors 722, 724 is increased, thereby causing the output node voltage of differential amplifier 720 (common drains of 724, 734) to decrease. When the output node voltage of differential amplifier 720 is decreased, the registration of rising transitions at buffer stage 750 is delayed and the registration of falling transitions at buffer stage 750 is hastened so that the time that the CMOS $CLK_{OUT}$ is at $V_{DD}$ is decreased and that duty cycle is decreased thereby.

Referring to FIG. 7, $D_{ADJ}$ and $CLK_{IN}$ are applied to differential amplifier 720 which generates CMOS output signal out which is in turn applied to buffer stage 750 which generates $CLK_{OUT}$. Referring FIGS. 7 and 11, as $D_{ADJ}$ increases, the voltage at the common drains of transistors 722, 732 and the common gates of transistors 722, 724 decreases, thereby causing the output node voltage out of differential amplifier 720 to increase. When the output node voltage out of differential amplifier 720 is increased, the registration of rising transitions at buffer stage 750 is hastened and the registration of falling transitions at buffer stage 750 is delayed so that the time that the CMOS $CLK_{OUT}$ is at $V_{DD}$ is increased and so that the duty cycle of $CLK_{OUT}$ is increased thereby. Thus, as $D_{ADJ}$ increases, the duty cycle increases.

Figure 11:
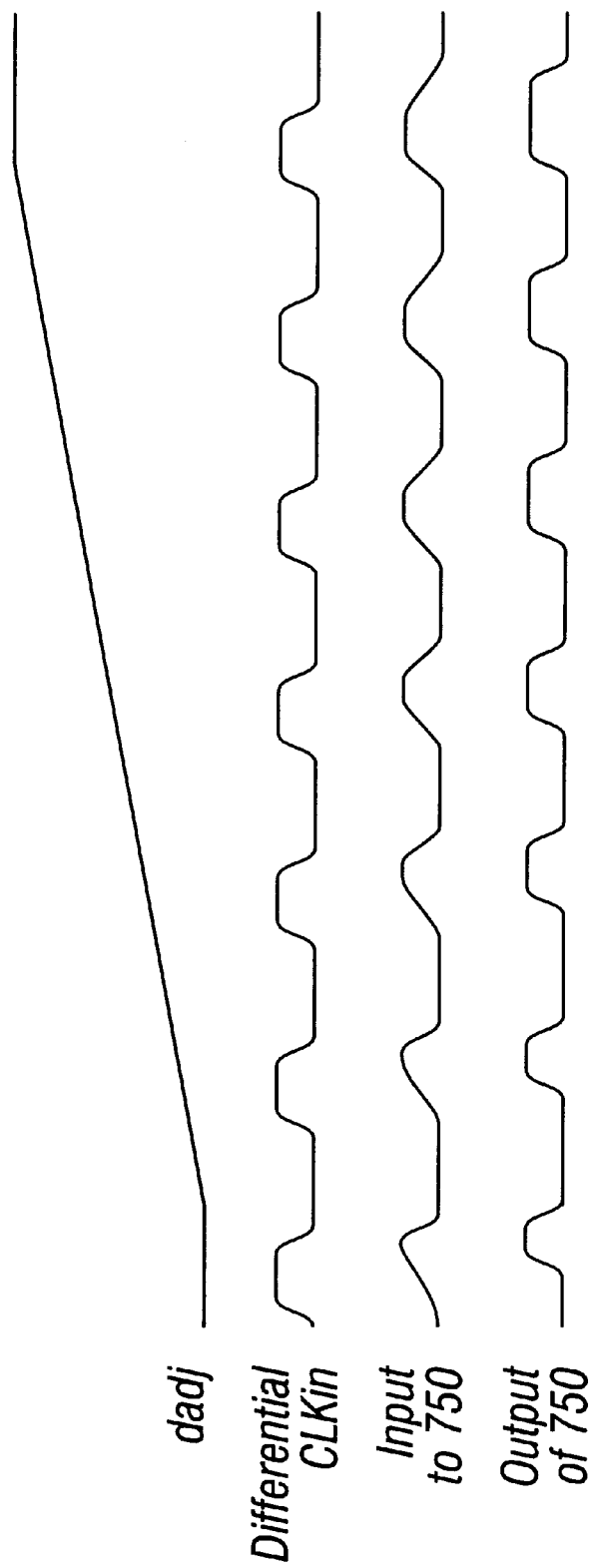
FIG. 11 shows a timing diagram of the relation of a duty cycle adjust control signal and a duty cycle adjusted clock signal according to the invention.

FIG. 11 shows a signal diagram for operation of differential amplifier 720 of FIG. 7. In this example, differential $CLK_{IN}$ initially has a duty cycle of less than 50%. However, as $D_{ADJ}$ is varied (e.g., increased), the output of buffer stage 750 $CLK_{OUT}$ is restored to a 50% duty cycle. $D_{ADJ}$ causes the input signal to buffer stage 750 to favor the leading or falling edge and thus change its duty cycle.

In one embodiment, duty cycle adjuster 14 receives one differential clock signal and generates an adjusted single-ended clock signal. Other embodiments of adjuster 14 may receive more than one differential clock signal and generate more than one single-ended clock signal. For example, FIG. 8 shows one embodiment of a clock distributor 800 including ten duty cycle adjusters 14A–J for generating ten single-ended CMOS clock outputs from ten differential clock phases of five differential clock input pairs. Clock distributor 800 buffers the five VCO clock signals because the loading of sense amplifiers, latches, etc., may be too much to place on the VCO directly. The buffering is performed as discussed above with reference to FIG. 7. Clock distributor 800 converts the ten differential clock phases into ten CMOS clocks that have appropriate duty cycles and transition times to drive the latching circuits. The first clock output from duty cycle adjuster 14A provides feedback to error indication circuit 16 and sense circuit 12.

Other exemplary embodiments of duty cycle adjuster 14 are shown in FIG. 9. For example FIG. 9A shows a single-ended duty cycle adjustment circuit 900A in which two inverters 912, 914 fight at a duty controlled clock out node. By driving $D_{ADJ}$ higher or lower at the input of analog inverter 914, one or the other of $CLK_{IN}$ transitions high or low will be favored at the output of inverters 912, 914. By favoring a falling transition, for example, the clock pulse falls more quickly and is high for less time. FIG. 9B shows another single-ended duty cycle adjustment circuit 900B in which the adjust signal $D_{ADJ}$ is applied in series with the clock through an inverter. The adjust signal weakens the pull-down or the pull-up of the clock, thereby making one edge faster or slower. Inverter 932 provides edge sharpening and is optional.

Figure 9F:
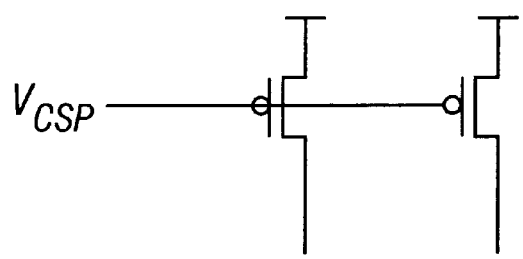

FIG. 9C shows a differential duty cycle adjustment circuit including load circuit 940, differential input pair transistors 962, 964 and bias current source transistor 972. In this embodiment, a differential a signal (e.g., see FIG. 10A) is applied to each of differential pair nodes. Similarly, a differential $D_{ADJ}$ signal may be applied to each of the differential pair drain nodes of FIG. 7. Alternatively, a single-ended $D_{ADJ}$ signal may be applied solely to one or the other side of circuit 900C (see, e.g., FIG. 7). Circuits $A_1$ and $A_2$ (952, 954) are optional. Each of circuits $A_1$ and $A_2$ may be, for example, an inverter, a pull-up PMOS transistor or a pull-down NMOS transistor. Load circuit 940 may be as shown in either of FIGS. 9D, 9E and 9F, or any combination thereof or otherwise. $V_{csp}$ in FIG. 9F is a fixed bias voltage.

Figure 10A:
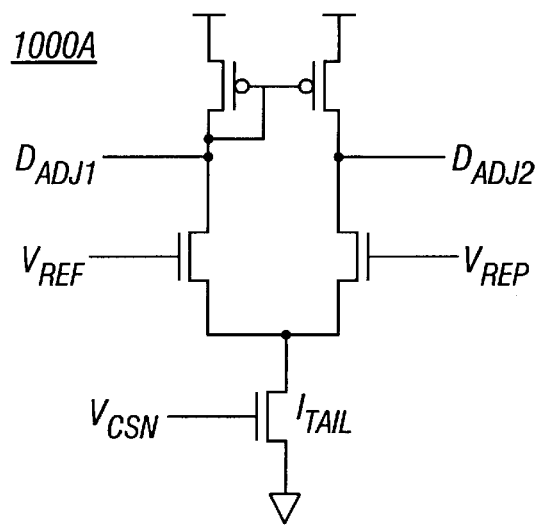
FIG. 10 shows various embodiments of duty cycle sense circuits according to the invention.
Figure 10B:
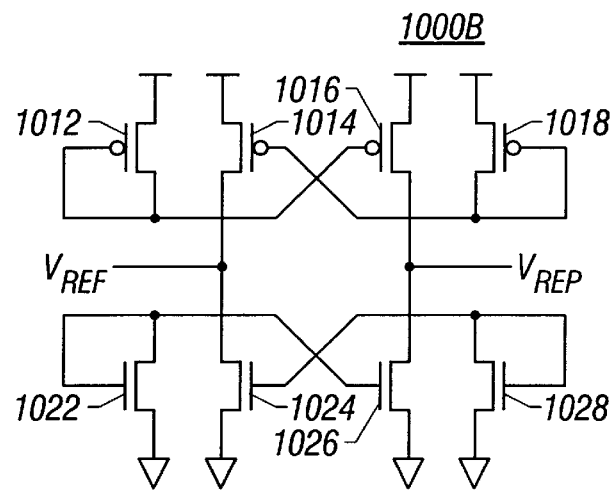
Figure 10C:
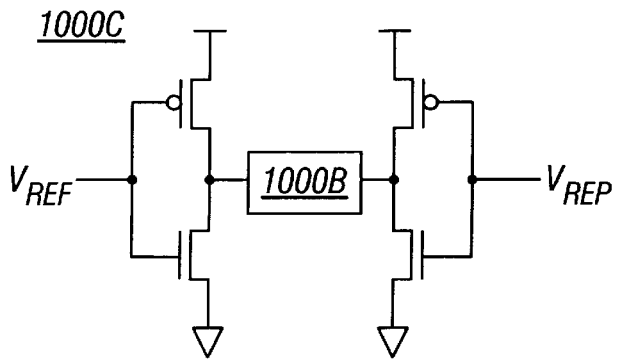

One embodiment of sense circuit 12 is described above with reference to FIGS. 5 and 6. Other embodiments of sense circuit 12 and/or of the operational amplifiers therein are shown in FIG. 10. For example, FIG. 10A shows an operational amplifier 1000A with differential input pair, PMOS bias current source. Operational amplifier 1000A can include either a single ended $D_{ADJ}$ output including $D_{ADJ}$ or $D_{ADJ}$ or a differential $D_{ADJ}$ output including $D_{ADJ1}$ and $D_{ADJ2}$ FIG. 10B shows a diode/cross-coupled operational amplifier 1000B which provides high differential amplification and low common mode resistance to input nodes $V_{REF}$ and $V_{REP}$. Diode coupled transistors 1012, 1018, 1022, 1028 create a low impedance path to their respective power rails. The cross-coupled PMOS transistors 1014, 1016 and NMOS transistors 1024, 1026 cancel the differential resistance while providing low common mode resistance. Preferably, the cross-coupled transistors have matched sizes to better cancel the differential resistance. The differential mode versus common mode current gain is equal to the differential to common mode resistance ratio. For instance, if a ratio of 20 is set, the differential mode gain is 5 and the common mode attenuation is ¼. Then $V_{REF}/V_{REP}$ can be directly used as differential or single-ended $D_{ADJ}$, or could be fed into another opamp. Also, low pass filter capacitors can still be placed on these nodes. FIG. 10C shows a further stage operational amplifier 1000C based on the amplifier of FIG. 10B.

Although FIG. 2 is shown to include conductance circuits 210 and 220, some embodiments may more specifically implement transconductances. In general, a transconductance embodiment includes control terminals which are each coupled to one of the power supply reference signals and the feedback clock signal. The control inputs control the amount of current transferred between two current handling terminals. The amount of current passing between the terminals and/or the resulting voltage swings at one of the terminals are compared to generate a duty cycle adjust signal as described above and hereinafter.

Figure 4:
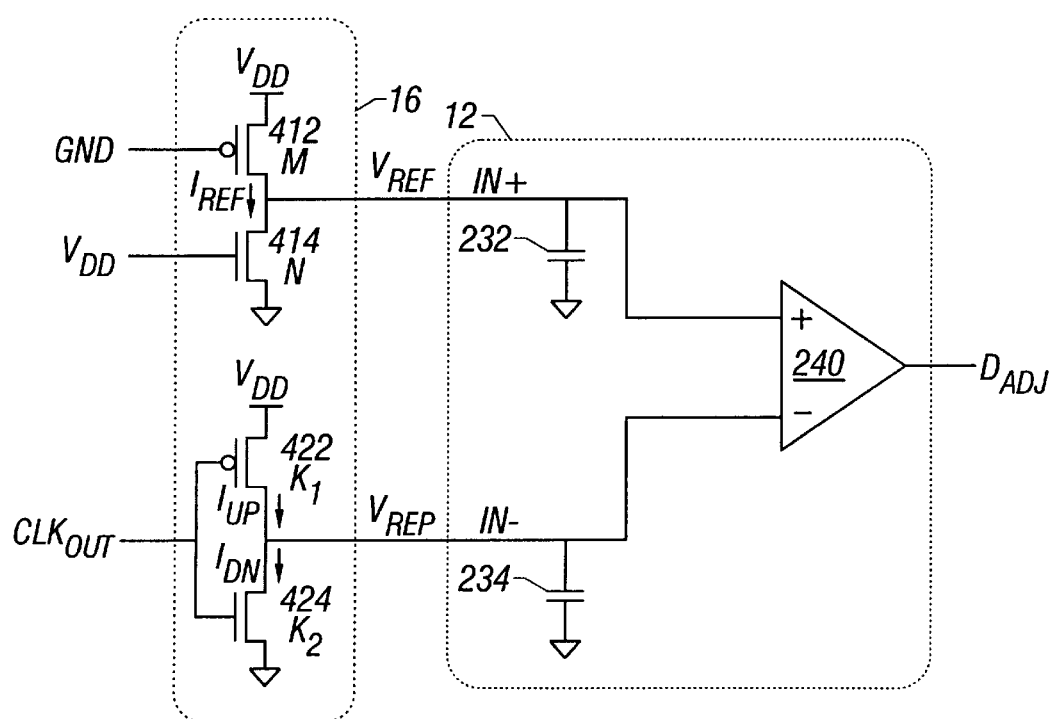
FIG. 4 is a circuit diagram of another embodiment of an error indication circuit and a duty cycle sense circuit according to the invention.

Specifically, FIG. 4 shows an alternative error indication circuit 16 and sense circuit 12. In the embodiment of FIG. 4, error indication circuit 16 includes a reference transconductance circuit including transistors 412, 414 and a feedback transconductance circuit including transistors 422, 424. Sense circuit 12 includes filter circuits 232, 234, and operational amplifier 240. $V_{DD}$ and ground are coupled to the gates of transistors 412 and 414, respectively. Transistors 412 and 414 are conducting to provide respective resistances to generate a reference voltage at node $V_{REF}$ by dividing the potential between $V_{DD}$ and ground. The clock signal CLK$_{OUT}$ is coupled to the gates of transistors 422, 424. Different transconductance circuits may be used to control the ratios to determine the values of the reference and feedback signals, thereby selecting the desired clock duty cycle.

Although the transconductances will be nonlinear, the nonlinearity exhibits only a common mode shift of $V_{REF}$, $V_{REP}$ and hence is rejected by differential amplifier 240. The common mode nonlinearity rejection of the transconductance embodiment of FIG. 4 is analogous to the common mode nonlinearity rejection of the conductance embodiment of FIG. 2. However, in the transconductance embodiment of FIG. 4, $I_{UP}$ is sourced from $V_{DD}$, and $I_{DN}$ is sunk from ground. Also, the single "K" factor of G222 in the embodiment of FIG. 2 is split into a $K_1$ for transconductance 422 and $K_2$ for transconductance 424 in the embodiment of FIG. 4. Hence, for the transconductance embodiment:

$$X \cdot K_1/M \cdot I_{REF} = (1-X) \cdot K_2/N \cdot I_{REF}$$

$$X \cdot (K_1/M + K_2/N) = K_2/N$$

$$X = (K_2/N)/(K_1/M + K_2/N)$$

$$X = (NK_1/MK_2 + 1)^{-1}$$

$$X = MK_2/(MK_2 + NK_1)$$

Thus, FIG. 2 shows a generalized error indication circuit 16 having circuits 210 and 220 which cause electrical effects to each of the respective input signals such that the nonlinearities of the electrical effects are common mode rejected. The electrical effect causes the input signals to undergo a transformation that may be dependent upon the process, voltage and temperature nonlinearities of circuit 16. In one embodiment of the invention, the electrical effect is a conductance, and circuits 210 and 220 are, for example, two-node nonlinear conductance circuits in which the current is drawn from the input voltage node. In one embodiment, the nonlinear conductances of circuits 210 and 220 are created simply and compactly by using pass-transistor PMOS and/or NMOS transistors. In another embodiment, the electrical effect is a transconductance, and circuits 210 and 220 are, for example, multi-node nonlinear transconductance circuits (see, e.g., FIG. 4) in which the current is drawn from a different node than the input voltage node. The nonlinear transconductances are created simply and compactly using small common-source PMOS and NMOS transistors (e.g., three-node circuit elements).

Other embodiments may include different resistance/conductance structures than those described above with reference to FIG. 3. Conductances 212, 214, 222 can be of any type of conductance. Because the ratios or relative values of conductances 212, 214, 222 are used to select the desired duty cycle, conductances 212, 214, 222 can have any value and can even be nonlinear. Process, temperature and voltage variations are irrelevant to conductances 212, 214, 222 since such variations affect the common mode of the relevant signals, which is advantageously rejected.

Any type of resistance may be used to implement conductance cell 300 (e.g., polysilicon resistors). In one embodiment of the invention, only one clock of several clocks provides the feedback clock signal to minimize used chip area and to minimize additional capacitance to the clocks. (See, e.g., CLK1 in FIG. 8.) However, any loading imbalance will cause a static phase error where the clock edge of the feedback clock is always late. Consequently, error indication circuit 16 uses PMOS and NMOS transistors rather than polysilicon resistors to implement the resistance in the feedback control loop formed by the one feedback CMOS clock signal that is averaged in duty cycle control circuit 10. The use of PMOS and NMOS transistors allows a higher resistance with less area and less deleterious capacitive loading on the feedback clock (e.g., CLK$_{OUT}$ in FIG. 1 and CLK1 in FIG. 8). Although the PMOS and NMOS transistors of feedback conductance circuit 220 include nonlinearities and body effect dependencies on their source terminal voltage, such non-ideal effects are matched by the PMOS and NMOS transistors of reference conductance circuit 210.

The transistors described herein (whether bipolar, field effect, etc.) may be conceptualized as having a control terminal which controls the flow of current between a first current handling terminal and a second current handling terminal. An appropriate condition on the control terminal causes a current to flow from/to the first current handling terminal and to/from the second current handling terminal. For example, where a control voltage has been described as being applied to a MOSFET gate terminal in the above described embodiments, other embodiments may be more generally described as having a control signal applied to a transistor control terminal.

In a bipolar NPN transistor, the first current handling terminal is the collector, the control terminal is the base, and the second current handling terminal is the emitter. A sufficient current into the base causes a collector-to-emitter current to flow. In a bipolar PNP transistor, the first current handling terminal is the emitter, the control terminal is the base, and the second current handling terminal is the collector. A current flowing between the base and emitter causes an emitter-to-collector current to flow.

Also, although field effect transistors (FETs) are frequently discussed as having a drain, a gate, and a source, in most such devices the drain is interchangeable with the source. This is because the layout and semiconductor processing of the transistor is frequently symmetrical. For an n-channel FET, the current handling terminal normally residing at the higher voltage is customarily called the drain. The current handling terminal normally residing at the lower voltage is customarily called the source. A sufficient voltage on the gate (relative to the source voltage) causes a current to flow from the drain to the source. The source voltage referred to in n-channel FET device equations merely refers to which drain or source terminal has the lower voltage at any given point in time. For example, the "source" of the n-channel device of a bi-directional CMOS transfer gate depends on which side of the transfer gate is at the lower voltage. To reflect this symmetry of most n-channel FET devices, the control terminal may be deemed the gate, the first current handling terminal may be termed the "drain/source", and the second current handling terminal may be termed the "source/drain". Such a description is equally valid for a p-channel FET device, since the polarity between drain and source voltages, and the direction of current flow between drain and source, is not implied by such terminology. Alternatively, one current-handling terminal may arbitrarily deemed the "drain" and the other deemed the "source", with an implicit understanding that the two are not distinct, but interchangeable.

Insulated gate FETs (IGFETs), are commonly referred to as MOSFET devices (which literally is an acronym for "Metal-Oxide-Semiconductor Field Effect Transistor"), even though the gate material may be polysilicon or some material other than metal, and the dielectric may be oxynitride, nitride, or some material other than an oxide. The use of such historically accepted terms as MOSFET should not be interpreted as restricted to a metal gate FET having an oxide dielectric.

Regarding the signals described herein, those skilled in the art will recognize that a signal may be directly transmitted from a first logic block to a second logic block, or a signal may be modified (e.g., amplified, attenuated, delayed, latched, buffered, inverted, filtered, digitized, level shifted or otherwise converted, etc.) between the logic blocks. Although the signals of the above described embodiment are characterized as being transmitted from one block to the next, other embodiments of the invention may include modified signals in place of such directly transmitted signals as long as the informational and/or functional aspect of the signal is transmitted between blocks. A signal transmitted from a first circuit block to a second circuit block may be characterized as including a first signal output from the first circuit block and a second signal (derived from the first signal) input to the second circuit block. To some extent, a second signal input at a second logic block may always be conceptualized as a signal derived from a first signal output from a first logic block due to physical limitations of the circuitry involved (e.g., there will always be some attenuation and delay). Therefore, as used herein, a second signal derived from a first signal includes the first signal or any modifications to the first signal, whether due to circuit limitations or due to passage through other circuit elements which do not impact the informational and/or functional aspect of the relevant signal.

Furthermore, those skilled in the art will recognize that circuit elements in circuit diagrams and boundaries between logic blocks are merely illustrative and that alternative embodiments may merge logic blocks or circuit elements or impose an alternate decomposition of functionality upon various logic blocks or circuit elements. For example, although capacitance circuits 232, 234 are shown as part of sense circuit 12, capacitance circuits 232, 234 may be included in error indication circuit 16 to form RC filter logic blocks. Moreover, alternative embodiments may combine multiple instances of a particular component. Also, although the transistors of the above described embodiment are MOSFETs, those skilled in the art will recognize that other types of transistors (e.g., bipolar transistors) and other circuits configured to perform similar functions may be used where appropriate. Additionally, as used herein, signal names may also refer to the nodes that carry the signals, and node names may also refer to the signals carried thereon.

While the invention has been described with reference to various embodiments, it will be understood that these embodiments are illustrative and that the scope of the invention is not limited to them. Many variations, modifications, additions, and improvements of the embodiments described are possible, and may fall within the scope of the invention as defined in the claims which follow.

What is claimed is:

1. A duty cycle error detection circuit for use in detecting a duty cycle error of a first clock signal, the first clock signal oscillating between first and second clock level voltages, the circuit comprising:

an error indication circuit coupled to receive a first clock level voltage signal, a second clock level voltage signal, and the first clock signal and coupled to provide a differential error signal at first and second outputs, the differential error signal having a duty cycle reference component signal at the first output and a first clock signal duty cycle component signal at the second output, the error indication circuit including a first circuit having a first conductance, the first circuit having an input coupled to receive the first clock level voltage signal and an output coupled to the first output, the first circuit includes a number M conductance cells coupled in parallel, wherein each conductance cell includes at least one n-type transistor coupled in parallel with at least one p-type transistor;

a second circuit having a second conductance, the second circuit having an input coupled to receive the second clock level voltage signal and an output coupled to the first output, the second circuit includes a number N conductance cells coupled in parallel, the ratio of conductance magnitudes of the first and second circuits being equal to M:N, wherein each conductance cell includes at least one n-type transistor coupled in parallel with at least one p-type transistor, the duty cycle reference component signal at the first output being equal to $M/(M+N)$ times a difference between the first and second clock level voltages;

a third circuit having the first electrical characteristic, the third circuit having an input coupled to receive the first clock signal and providing the first clock signal duty cycle component coupled to the second output, the first, second and third circuits having inherent nonlinearities manifested as a common mode noise component of the differential error signal; and a common mode rejection circuit coupled to receive the differential error signal, the common mode rejection circuit being configured to reject the common mode noise component of the differential error signal and to provide a duty cycle adjust signal having a value determined by a difference between the duty cycle reference component signal and an average value of the first clock signal duty cycle component signal.

2. The circuit of claim 1, further comprising:

a duty cycle adjuster coupled to receive a second clock signal and the duty cycle adjust signal, the duty cycle adjuster providing the first clock signal, the first clock signal being a single-ended CMOS clock signal having a duty cycle determined by the duty cycle adjust signal; and wherein M equals 3;

N equals 1; and the duty cycle of the clock signal is 75% at the first clock level voltage and 25% at the second clock level voltage.

3. The circuit of claim 1, further comprising:
a duty cycle adjuster coupled to receive a second clock signal and the duty cycle adjust signal, the duty cycle adjuster providing the first clock signal, the first clock signal being a single-ended CMOS clock signal having a duty cycle determined by the duty cycle adjust signal; and wherein M equals N; and the duty cycle of the first clock signal is 50% at the first clock level voltage and 50% at the second clock level voltage.

4. The circuit of claim 1, wherein
the third conductance includes K conductance cells coupled in parallel.

5. The circuit of claim 1 wherein each conductance cell includes three series connected n-type transistors coupled in parallel with one p-type transistor.

6. The circuit of claim 1, wherein
the first clock level voltage is a first power voltage;
the second clock level voltage is a second power voltage; and
the first and second circuits provide a voltage divider, the first circuit being coupled between a first power node having the first power voltage and a voltage divider output, the second circuit being coupled between a second power node having the second power voltage and the voltage divider output, the voltage divider output being coupled to the first output, the duty cycle reference component signal having a voltage equal to a percentage of the difference between the first power voltage and the second power voltage.

7. The circuit of claim 6 wherein
the first power voltage is $V_{DD}$;
the second power voltage is ground; and
the duty cycle reference component signal has a voltage equal to (M/(M+N))·VDD.

8. The circuit of claim 1, wherein
the first electrical characteristic is a transconductance;
the first circuit includes a first transconductance circuit;
the second circuit includes a second transconductance circuit; and
the third circuit includes a third transconductance circuit and a fourth transconductance circuit; and wherein
the duty cycle reference component signal is determined by a ratio of transconductance magnitudes of the first and second transconductance circuits.

9. The circuit of claim 8, wherein
the first transconductance circuit includes a number M transconductance cells coupled in parallel; and
the second transconductance circuit includes a number N transconductance cells coupled in parallel;
the third transconductance circuit includes a number $K_1$ transconductance cells coupled in parallel;
the fourth transconductance circuit includes a number $K_2$ transconductance cells coupled in parallel.

10. The circuit of claim 9, further comprising:
a duty cycle adjuster coupled to receive a second clock signal and the duty cycle adjust signal, the duty cycle adjuster providing the first clock signal, the first clock signal being a single-ended CMOS clock signal having a duty cycle determined by the duty cycle adjust signal; and wherein M equals 3;
N, $K_1$ and $K_2$ equal 1; and
the duty cycle of the first clock signal is 75% at the first clock level voltage and 25% at the second clock level voltage.

11. The circuit of claim 9 wherein each transconductance cell comprises at least one transistor.

12. The circuit of claim 9 wherein
the first and third transconductance circuits are pull-up transconductance circuits; and
the second and fourth transconductance circuits are pull-down transconductance circuits.

13. The circuit of claim 12 wherein
the first transconductance circuit includes a p-type transistor including
a control terminal coupled to ground;
a first current handling terminal coupled to the first clock level voltage signal; and
a second current handling terminal coupled to the first output;
the second transconductance circuit includes an n-type transistor including
a control terminal coupled to $V_{DD}$;
a first current handling terminal coupled to the second clock level voltage signal; and
a second current handling terminal coupled to the first output;
the third transconductance circuit includes a p-type transistor including
a control terminal coupled to receive the first clock signal;
a first current handling terminal coupled to the first clock level voltage signal; and
a second current handling terminal coupled to the second output;
the fourth transconductance circuit includes an n-type transistor including
a control terminal coupled to receive the first clock signal;
a first current handling terminal coupled to the second clock level voltage signal; and
a second current handling terminal coupled to the second output.

14. A duty cycle error detection circuit for use in detecting a duty cycle error of a first clock signal, the first clock signal oscillating between first and second clock level voltages, the circuit comprising:
an error indication circuit coupled to receive a first clock level voltage signal, a second clock level voltage signal, and the first clock signal and coupled to provide a differential error signal at first and second outputs, the differential error signal having a duty cycle reference component signal at the first output and a first clock signal duty cycle component signal at the second output, the error indication circuit including
a first circuit having a first electrical characteristic, the first circuit having an input coupled to receive the first clock level voltage signal and an output coupled to the first output;
a second circuit having the first electrical characteristic, the second circuit having an input coupled to receive the second clock level voltage signal and an output coupled to the first output, the duty cycle reference component signal at the first output being determined by a ratio of magnitudes of the first electrical characteristic of the first circuit and the first electrical characteristic of the second electrical circuit;

a third circuit having the first electrical characteristic, the third circuit having an input coupled to receive the first clock signal and providing the first clock signal duty cycle component coupled to the second output, the first, second and third circuits having inherent nonlinearities manifested as a common mode noise component of the differential error signal; and a common mode rejection circuit coupled to receive the differential error signal, the common mode rejection circuit being configured to reject the common mode noise component of the differential error signal and to provide a duty cycle adjust signal having a value determined by a difference between the duty cycle reference component signal and an average value of the first clock signal duty cycle component signal, wherein the common mode rejection circuit comprises an operational amplifier, the operational amplifier comprising:
 a first amplification stage, the first amplification stage including;
  a source coupled differential input transistor pair having control terminals coupled to receive the differential error signal;
  a bias current transistor pair coupled to provide a tail bias current to the differential input transistor pair; and
  a diode load transistor pair coupled to the differential input transistor pair and the bias current transistor pair; and
 a second amplification stage, the second amplification stage including
  an output transistor pair, each transistor of the output transistor pair being coupled in a current mirror configuration with one of the diode load transistor pair; and
  a folded load transistor pair coupled to the output transistor pair.

15. A duty cycle error detection circuit for use in detecting a duty cycle error of a first clock signal, the first clock signal oscillating between first and second clock level voltages, the circuit comprising:
 an error indication circuit coupled to receive a first clock level voltage signal, a second clock level voltage signal, and the first clock signal and coupled to provide a differential error signal at first and second outputs, the differential error signal having a duty cycle reference component signal at the first output and a first clock signal duty cycle component signal at the second output, the error indication circuit including
  a first circuit having a first electrical characteristic, the first circuit having an input coupled to receive the first clock level voltage signal and an output coupled to the first output;
  a second circuit having the first electrical characteristic, the second circuit having an input coupled to receive the second clock level voltage signal and an output coupled to the first output, the duty cycle reference component signal at the first output being determined by a ratio of magnitudes of the first electrical characteristic of the first circuit and the first electrical characteristic of the second electrical circuit;
  a third circuit having the first electrical characteristic, the third circuit having an input coupled to receive the first clock signal and providing the first clock signal duty cycle component coupled to the second output, the first, second and third circuits having inherent nonlinearities manifested as a common mode noise component of the differential error signal; a common mode rejection circuit coupled to receive the differential error signal, the common mode rejection circuit being configured to reject the common mode noise component of the differential error signal and to provide a duty cycle adjust signal having a value determined by a difference between the duty cycle reference component signal and an average value of the first clock signal duty cycle component signal; and
 a duty cycle adjuster coupled to receive a second clock signal and the duty cycle adjust signal, the duty cycle adjuster providing the first clock signal, the first clock signal being a single-ended CMOS clock signal having a duty cycle determined by the duty cycle adjust signal, wherein the duty cycle adjuster comprises:
  a differential amplifier coupled to receive the duty cycle adjust signal, the differential amplifier including;
   a folded load transistor pair;
   a source coupled differential input transistor pair having control terminals coupled to receive a differential input clock signal and each transistor of the differential input transistor pair having a drain coupled to one transistor of the folded load transistor pair, the second clock signal including the differential input clock signal; and
   a current source coupled to a common source of the differential input transistor pair provide a bias current to the differential input transistor pair, the differential amplifier receiving the duty cycle adjust signal at the drain of at least one of the differential input pair for adjusting current through the folded load transistor pair to adjust transitions of an output signal of the differential amplifier; and
 a CMOS buffer stage coupled to receive the output signal of the differential amplifier and to provide the first clock signal, the first clock signal being duty cycle adjusted.

* * * * *